US012593647B2

(12) United States Patent
Fuller et al.

(10) Patent No.: US 12,593,647 B2
(45) Date of Patent: Mar. 31, 2026

(54) REMOTE OPTIMIZATION OF PURGE FLOW RATES IN A CONTAINER

(71) Applicant: ENTEGRIS, INC., Billerica, MA (US)

(72) Inventors: Matthew A. Fuller, Colorado Springs, CO (US); Nathan Burget, Colorado Springs, CO (US); Katerina Alexe Reynolds, Colorado Springs, CO (US); Colton J. Harr, Monument, CO (US); Michael C. Zabka, New Prague, MN (US)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 17/564,842

(22) Filed: Dec. 29, 2021

(65) Prior Publication Data

US 2022/0208582 A1      Jun. 30, 2022

Related U.S. Application Data

(60) Provisional application No. 63/132,342, filed on Dec. 30, 2020.

(51) Int. Cl.
*H01L 21/673* (2006.01)
*H01L 21/67* (2006.01)
*H01L 21/677* (2006.01)

(52) U.S. Cl.
CPC .. *H01L 21/67389* (2013.01); *H01L 21/67253* (2013.01); *H01L 21/67769* (2013.01)

(58) Field of Classification Search
None
See application file for complete search history.

(56) References Cited

U.S. PATENT DOCUMENTS

| | | | |
|---|---|---|---|
| 9,305,817 B2 | 4/2016 | Kaise et al. | |
| 10,818,529 B2 | 10/2020 | Murata et al. | |
| 2011/0220545 A1 | 9/2011 | Ra | |
| 2012/0083918 A1* | 4/2012 | Yamazaki | ......... H01L 21/67389 |
| | | | 700/112 |
| 2016/0358799 A1* | 12/2016 | Murata | ............. H01L 21/67373 |
| 2018/0161830 A1 | 6/2018 | Sasaki | |

(Continued)

FOREIGN PATENT DOCUMENTS

| | | |
|---|---|---|
| CN | 103193051 A | 7/2013 |
| JP | 2012248887 A | 12/2012 |
| JP | 2018098358 A | 6/2018 |

(Continued)

*Primary Examiner* — Natasha N Campbell

(57) ABSTRACT

Optimizing purge flow parameters in a substrate container, includes streaming a purge working fluid into an interior of the substrate container, discharging the purge working fluid from the interior of the substrate container, and varying purge flow parameters of the purge working fluid for a predetermined period of time, detecting at least one environmental condition in the interior of the substrate container during the predetermined period of time, determining optimized purge flow parameters based on the varied purge flow parameters and the at least one detected environmental condition during the predetermined period of time, and adjusting the streaming and the discharging in accordance with the optimized purge flow parameters. The substrate container may include, for example, a front opening unified pod or a reticle pod.

9 Claims, 9 Drawing Sheets

(56)  References Cited

U.S. PATENT DOCUMENTS

| 2018/0247846 | A1 | 8/2018 | Murata et al. |
| 2020/0402826 | A1 | 12/2020 | Lin |

FOREIGN PATENT DOCUMENTS

| KR | 20180134300 | A | 12/2018 |
| KR | 20200020572 | A | 2/2020 |
| KR | 102135264 | B1 | 7/2020 |
| TW | 200410305 | A | 6/2004 |
| TW | 201420220 | A | 6/2014 |
| TW | 201922599 | A | 6/2019 |
| WO | 2016065200 | A1 | 4/2016 |

* cited by examiner

REMOTE OPTIMIZATION OF PURGE FLOW RATES IN A CONTAINER

FIELD

This disclosure is directed to controlling an environment within a wafer or reticle carrying substrate container such as front opening unified pods (FOUP).

BACKGROUND

Substrates in the form of wafers may be processed to form semiconductor devices. Substrates may include glass, silicon, or any other material(s) suitable for semiconductor devices. A substrate may have a panel shape, and the panel may be circular, rectangle, or any other shape suitable for processing and carrying in a container. The wafer substrates, hereafter "substrates," undergo a series of process steps that include material layer deposition, doping, etching, or chemically or physically reacting material(s) of a particular substrate. A substrate container is used for storing the substrate and transporting the in-process substrates within a fabrication facility. Substrate containers include, for example, FOUPs, which typically include a shell having an internal space for holding substrates, and a plate for interfacing with various conveyors and other devices so that, for example, the FOUP may be moved around the processing facility. The shell and the plate are fixed to one another, for example by welding, bonding, connectors, etc.

During processing, gasses must be introduced and removed from the FOUP, for example during purge processes, thus requiring that the FOUP have one or more locations at which gas may enter or leave the FOUP. e.g. Substrates may be transferred from the FOUP to processing equipment through an equipment front end module (EFEM) that generally includes a load port for receiving the FOUP, a transfer unit, a frame or "mini-environment", and a fan filter unit used to generate gas flow within the EFEM.

When the FOUP is docked on a load port, a door of the load port interfaces with a door of the FOUP and disengage the door of the FOUP from a shell of the FOUP. When the door of the FOUP is disengaged (opened) from the shell, the EFEM permits the transfer unit housed within the EFEM to access the substrates stored within the FOUP. A flow of gas introduced by a fan filter unit flows through the EFEM from a top of the EFEM to a bottom of the EFEM.

SUMMARY

This disclosure is directed to optimizing purge flow parameters for wafer or reticle carrying substrate containers such as FOUPs or pods (e.g., reticle pods) that are used, for example, in semiconductor manufacturing. More specifically, this disclosure is directed to remotely measuring environmental conditions within a FOUP, such as relative humidity, etc. in real-time while purging; and further remotely optimizing purge flow parameters, such as purge flow rates, in various scenarios including open or closed door purge processes.

In at least one example embodiment, a system includes a first processing device disposed in an interior of a FOUP, which also has a substrate inserted therein. The system also includes a sensor communicatively coupled to the first processing device within the interior of the FOUP. The sensor may be configured to detect at least one environmental condition in the interior of the FOUP. In accordance with at least one example embodiment, the first processing device, the sensor, or combinations thereof may be located on an inner wall of the FOUP or on a door of the FOUP, being integral to the inner wall or door or being attached to the inner wall or door. In accordance with at least one other example embodiment, either the first processing device, the sensor, or both may be located on a substrate or a wafer, or located within or adjacent to a purge module that is disposed in the interior of the FOUP.

In at least one example embodiment, a method of optimizing purge flow parameters in a FOUP includes streaming a purge working fluid into an interior of the FOUP, discharging the purge working fluid from the interior of the FOUP, varying purge flow parameters of the purge working fluid for a predetermined period of time, detecting at least one environmental condition in the interior of the FOUP during the predetermined period of time, determining optimized purge flow parameters based on the varied purge flow parameters and the at least one detected environmental condition during the predetermined period of time, and adjusting the streaming and the discharging in accordance with the optimized purge flow parameters.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
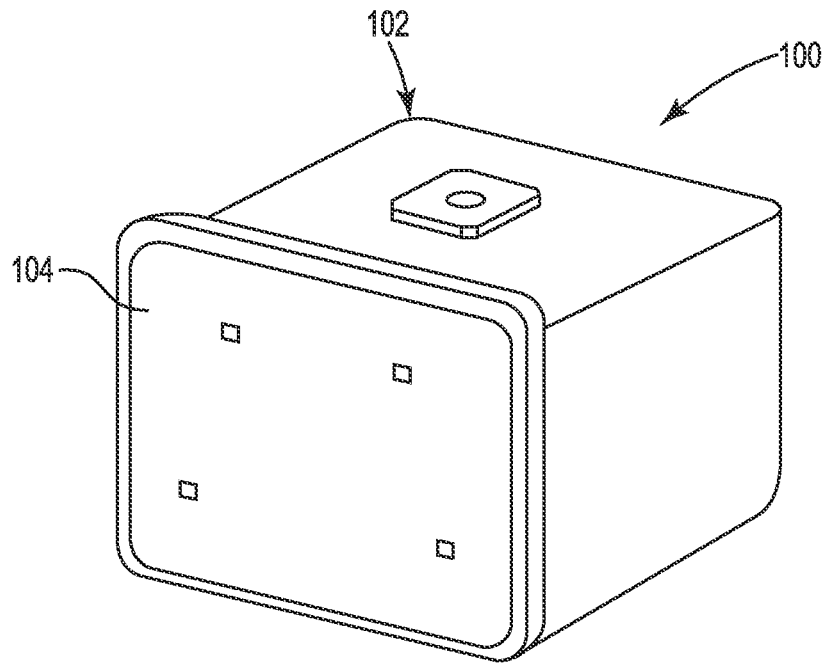
FIG. 1 is a front prospective view of a substrate container, according to at least one example embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current example embodiment. Still, the example embodiments described in the detailed description, drawings, and claims are not intended to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

This disclosure is directed to optimizing purge flow parameters for wafer- or reticle-carrying substrate containers such as FOUPs or reticle pods used, for example, in semiconductor manufacturing. More specifically, this disclosure is directed to remotely measuring environmental conditions such as relative humidity, etc. in real-time during a purge process, and remotely optimizing purge flow parameters such as purge flow rates in a substrate container in various scenarios, such as during open or closed door purge processes in FOUPs.

As defined herein, the term "real-time" or "real time" may refer to various operations in computing or other processes that must guarantee response times within a specified or predetermined time (deadline), usually within an order of fractions of e.g., a second. A real-time process is generally one that happens in defined time steps of maximum duration and fast enough to affect the environment in which it occurs.

It will be appreciated that substrates in the form of wafers may be processed to form semiconductor devices. A substrate container may be used to hold such substrates during processing. In at least one non-limiting embodiment, the container may be a reticle container. The substrate container may be accessed through a front opening or cover of the substrate container.

In one embodiment when purging a FOUP (e.g., open door purge, closed door purge, etc.), typically environmental conditions such as the relative humidity (% RH) may be measured or detected, e.g., by one or more sensors, and the detected % RH data may be stored using e.g., % RH data loggers. The sensors, data loggers, or a combination thereof may be placed on the substrates inside the FOUP and positioned to capture the % RH measurements in various locations (e.g., front, back, right, and left of an interior of the FOUP at various slots that accommodate the wafers). After the purge process is completed, the sensors or data loggers may be removed from the substrates, and the stored % RH data may be downloaded to a controller and analyzed by the controller to determine the relationship between the % RH data and the environmental conditions under which the % RH data are obtained. Alternatively, sensors or data loggers may be attached to structural elements of a FOUP, for example, wafer supports.

In at least one example embodiment, while purging a substrate carrier such as a FOUP, environmental conditions, for example the % RH, may be measured or detected e.g., by one or more sensors within the FOUP, and the detected % RH data may be communicated to an external controller or processor via an internal controller or processor inside the FOUP in real-time. The sensor(s) may be coupled to the controller within the FOUP, which communicates the detected % RH data to the external controller in real-time. In at least one example embodiment, the sensor(s) may be placed on the wafers inside the FOUP so as to capture the % RH in various locations (e.g., front, back, right, and left of the interior of the FOUP, at various slots that accommodate the wafers). In at least one other example embodiment, the sensor(s) may be located on an inner wall of the FOUP or a door (at an inner side) of the FOUP, e.g., being integral to the inner wall or the door or being attached to the inner wall or the door.

In at least one example embodiment, the internal controller may perform in place of the external controller, and thus the external controller may be optional. In at least one example embodiment, the internal controller may be located in the FOUP, in the EFEM, or at any other locations suitable for communicating with the sensors. In at least one example embodiment, the external controller may be configured to monitor the real-time environmental conditions such as the % RH inside a FOUP during a purge process. The external controller and/or a user may make adjustments (e.g., to the FOUP geometry, purge design (e.g., the number and/or configuration of the inlet/outlet purge ports), EFEM configuration, purge flow parameters (e.g., gas flow rate), etc.) such that the purge process, the purge efficiency, and the purge performance may be fine-tuned and optimized in real-time. In addition, the external controller may store the corresponding adjustment results (e.g., the optimized gas flow rate, etc.) for each of the different applicable operational scenarios (e.g., open door purge, closed door purge, etc.) as a set of individualized purge "recipes" available for optimizing a specified environmental response (e.g., a desired pressure, etc.) during the purge process when the corresponding operational scenario occurs.

FIG. 1 is a front prospective view of a substrate container 100, according to at least one embodiment.

As shown in FIG. 1, the substrate container 100 includes a door 104 and a shell 102. The door 104 couples to the shell 102 and forms an enclosed interior space. The door 104 may be coupled to shell 102 by being mechanically latched or suction-fitted within a corresponding opening of shell 102; or, alternatively, the door 104 may be coupled to shell 102 (e.g., via a hinge) on one of the top, bottom, or either side of the corresponding opening of shell 102. In at least one example embodiment, the door of the FOUP may be coupled to shell of the FOUP on a bottom opening of the shell.

Figure 2:
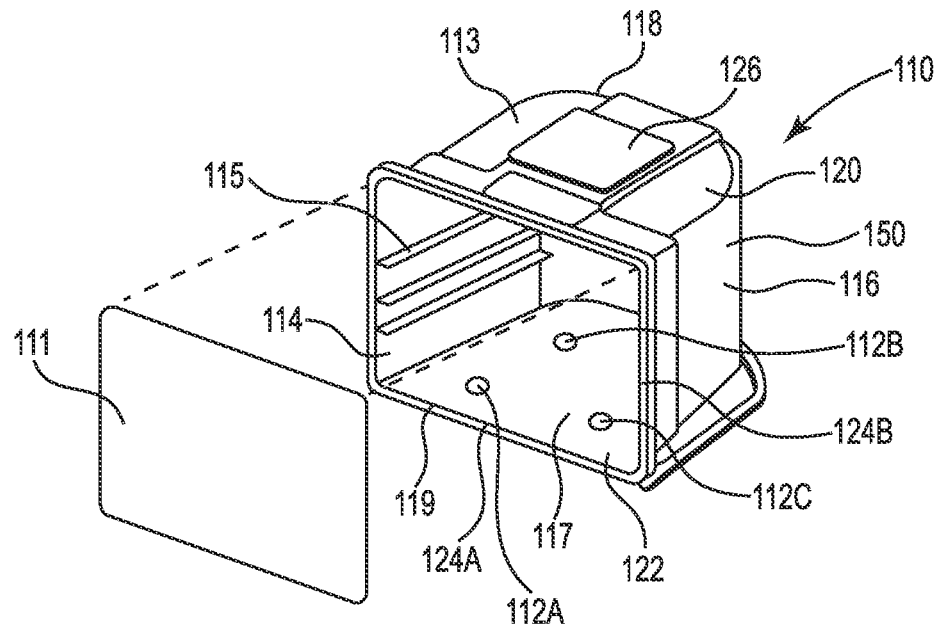
FIG. 2 is an exploded view of a substrate container, according to at least one example embodiment.

FIG. 2 is an exploded view of a substrate container 110, according to at least one example embodiment FIG. 2 illustrates substrate container 110 with the door 111 removed (e.g., opened). As shown in FIG. 2, the shell 113 defines an interior space 117 of the substrate container 110 in which substrates may be stored.

The shell 113 may include an opening 119, which may be enclosed by door 111 coupled to the shell 113. The substrate container 110 may be accessed by moving (e.g., opening, removing) the door 111. For example, the door 111 may be coupled to the shell 113 by fitting the door 111 into the opening 119 of shell 113. In at least one example embodiment, one or more of the door 111 and the shell 113 may include a locking mechanism (not shown) to prevent inadvertent opening or removal of the door 111. In at least another example embodiment, the opening of the shell 113 may be at the bottom of the shell.

As shown in FIG. 2, the shell 113 may further include a first side wall 114, a second side wall 116, a rear wall 118, and a top wall 120, and a bottom wall 122.

In at least one example embodiment, the first side wall 114 may be opposed and parallel to the second side wall 116, separated by the top wall 120 and the bottom wall 122. The first side wall 114 may be referred to as the left side while the right side 116 may be referred to as the right side, though the designation of "left" or "right" is a matter of viewing perspective, and is not intended to be limiting in any manner.

The top wall 120 and bottom wall 122 each extend between the first side wall 114 and the second side wall 116. In at least one example embodiment, the top wall 120 may be opposed and parallel to the bottom wall 122 separated by the first side wall 114 and the second side wall 116. The bottom wall 122 includes an edge 124A that extends along the front opening 119. The edge 124A also extends between the first side wall 114 and the second side wall 116 of the shell 113. The first side wall 114 includes an edge 124B that extends along the front opening 119. The edge 124B of the first side wall 114 also extends between the top wall 120 and the bottom wall 122 of the shell 113. The front edges 124A and 124B, in at least one example embodiment, are perpendicular to each other and define the front opening 119.

The substrate container 110 may include an equipment connector (also referred to as an "automation flange") 126 on the top wall 120 of the shell 113. In at least one example embodiment, the equipment connector 126 allows an automated attachment (not shown) for moving the substrate container 110. The automated attachment may include, but not be limited to, an automated arm (also referred to as an "overhead transfer system"), that may be connected to the substrate container 110. For example, the automated arm may be used to move the substrate container 110 between different pieces of processing equipment. In at least one example embodiment, the substrate container 110 may include one or more handles (not shown) to allow a user (e.g., a technician, etc.) to manually move the substrate container 110.

The substrate container 110 may further include a plurality of shelves 115 for holding substrates in the interior space 117.

In at least one example embodiment, the interior space 117 includes internal walls/surfaces of walls 114, 116, 118, 120, and/or 122. The portions of the shelves 115 on the interior surface of second side wall 116 are obscured in FIG. 2, which may have a similar configuration to the portions on the shelves 115 on the first side wall 114. The shelves 115 on the interior surface of walls 114 and 116 may be configured to cooperatively hold a substrate (not shown) within the interior space 117. For example, the shelves 115 may form and/or define slots and are sized to hold a specific size of substrate (e.g., 150 mm wafers, 200 mm wafers, etc.).

In accordance with at least one example embodiment, when the door 111 of the substrate container 110 is open, purge gas may be supplied to the interior space 117 to reduce ingress of the external environment (e.g., gas, particles, humidity, etc.) through the front opening 119 into the substrate container 110. For example, the supplied purge gas may flow out from interior space 117 through the front opening 119, thus reducing any gas or substance from flowing inward into the interior space 117 through the front opening 119. In at least one example embodiment, a door of a load port is configured to interface with the door 111 and disengage the door 111 from the shell 113 (to open the door 111). In at least one example embodiment, a controller is configured to open/close the door 111. A purge process may be controlled before door opening, during door opening, while door is closing, and when door is closed. The purge gas may be a generally inert gas such as nitrogen. The purge gas may also be clean dry air (CDA) or extra clean dry air (xCDA). The purge gas may further be any gas used to condition the substrates or any other suitable gas. It will be appreciated that a purge tower, diffuser or manifold (not shown) may facilitate the flow of gaseous working fluid or purge gas into the substrate container 110 such that the purge gas may be directed toward and then away from the wafers housed in the substrate container 110. The purge gas may sweep the container and its contents, picking up residual moisture, oxygen and atmospheric micro-contaminants (AMCs) and encouraging movement of particulates toward outlet purge port(s) or door opening.

The bottom wall 122 of the substrate container 110 includes inlet purge port(s) (112A, 112B, 112C) for supplying the purge gas into the interior space 117. For example, the substrate container 110 may be supplied with a first stream of purge gas through a first inlet purge port 112A, a second stream of purge gas through a second inlet purge port 112B, a third stream of purge gas through a third inlet purge port 112C or a combination thereof. In at least one example embodiment, one or more of the inlet purge ports (112A, 112B, 112C) may be configured as either an inlet purge port or an outlet purge port. The substrate container 110 may include a fourth inlet/outlet purge port (not shown). The embodiments described and recited herein are not limited to four or fewer purge ports. That is, the quantity described and recited herein are provided for descriptive purposes only and are not intended to be limiting. In at least one example embodiment, the inlet/outlet purge port(s) may be disposed on side walls of the substrate container 110.

The shell 113 has an external surface 150. Each of the inlet/outlet purge port(s) (112A, 112B, 112C, etc.) extends from the interior space 117 through the bottom wall 122 to the external surface 150 of the shell 113. The substrate container 110 may include four inlet/outlet purge port(s) or a different number of inlet/outlet purge port(s). In at least one example embodiment, the substrate container 110 may include one or more inlet purge ports. In at least one example embodiment, the substrate container 110 may include one or more front inlet purge ports (corresponding to and in fluid connection with 210 and/or 240 of FIG. 5, respectively) and one or more rear inlet purge ports (corresponding to and in fluid connection with 220 and/or 230 of FIG. 5, respectively). In at least one example embodiment, one or more of the front purge ports may be outlet purge port(s) for discharging gas in the interior space 117 out of the substrate container 110.

The inlet purge port(s) (112A, 112B, 112C) may allow a fluid such as a purge gas (for example, nitrogen) to flow into the substrate container 110. A check valve (not shown, for example, a mechanical check valve) may be provided to facilitate the flow of a fluid, including gases being purged from the substrate container 110, from the internal space 117 of the substrate container 110 out through outlet purge port(s) (112A, 112B, 112C, or the fourth purge port).

Figure 3:
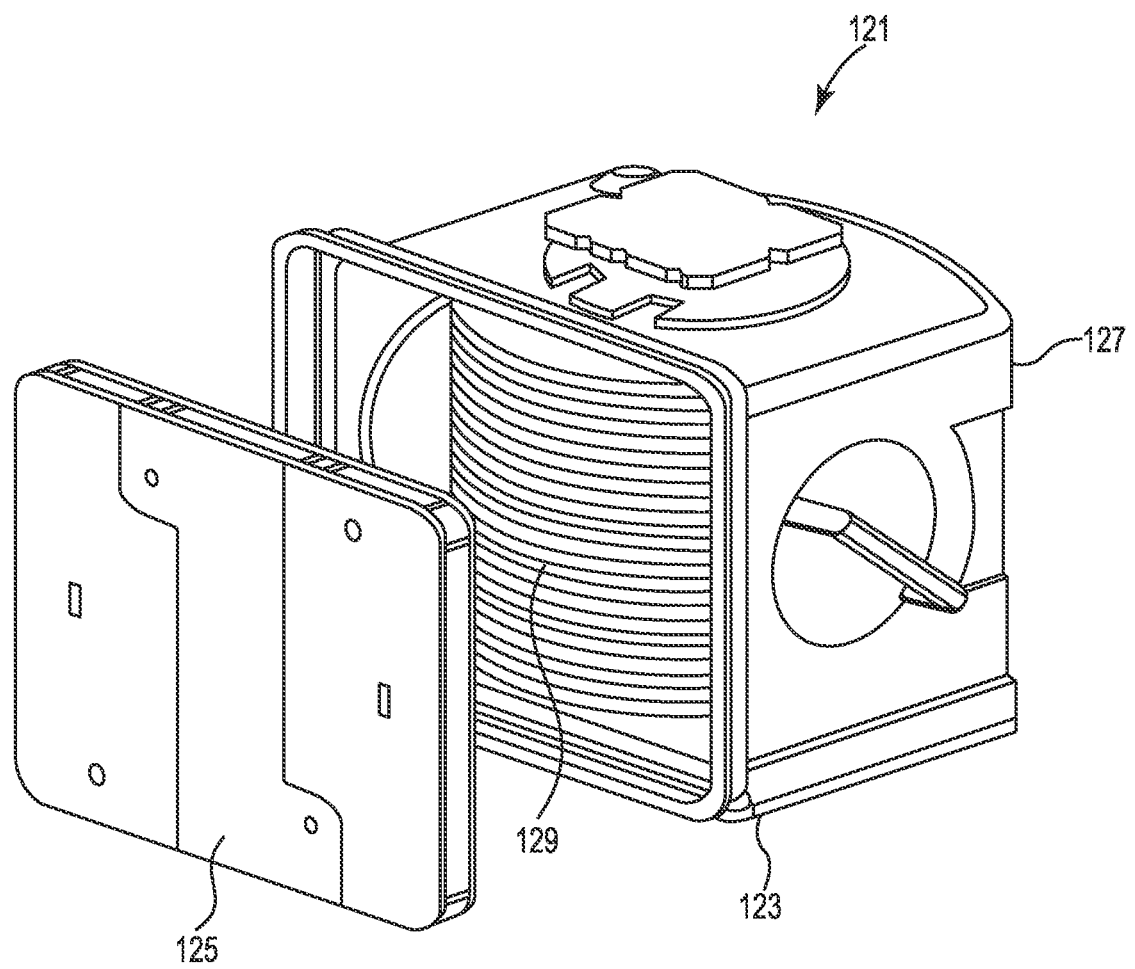
FIG. 3 is an exploded view of a substrate container, according to at least one other example embodiment.

FIG. 3 is an exploded view of a substrate container 121, according to at least one example embodiment. The substrate container 121 includes an open front 123, a door 125, and a shell 127. Wafers 129 may be inserted and removed horizontally through the open front 123. Slots (not visible) formed in the interior sides of the shell 127 accommodate the wafers 129. The door 125 may include a seal to engage with the shell 127 to form an internal environment that is isolated from the ambient atmosphere.

Figure 4:
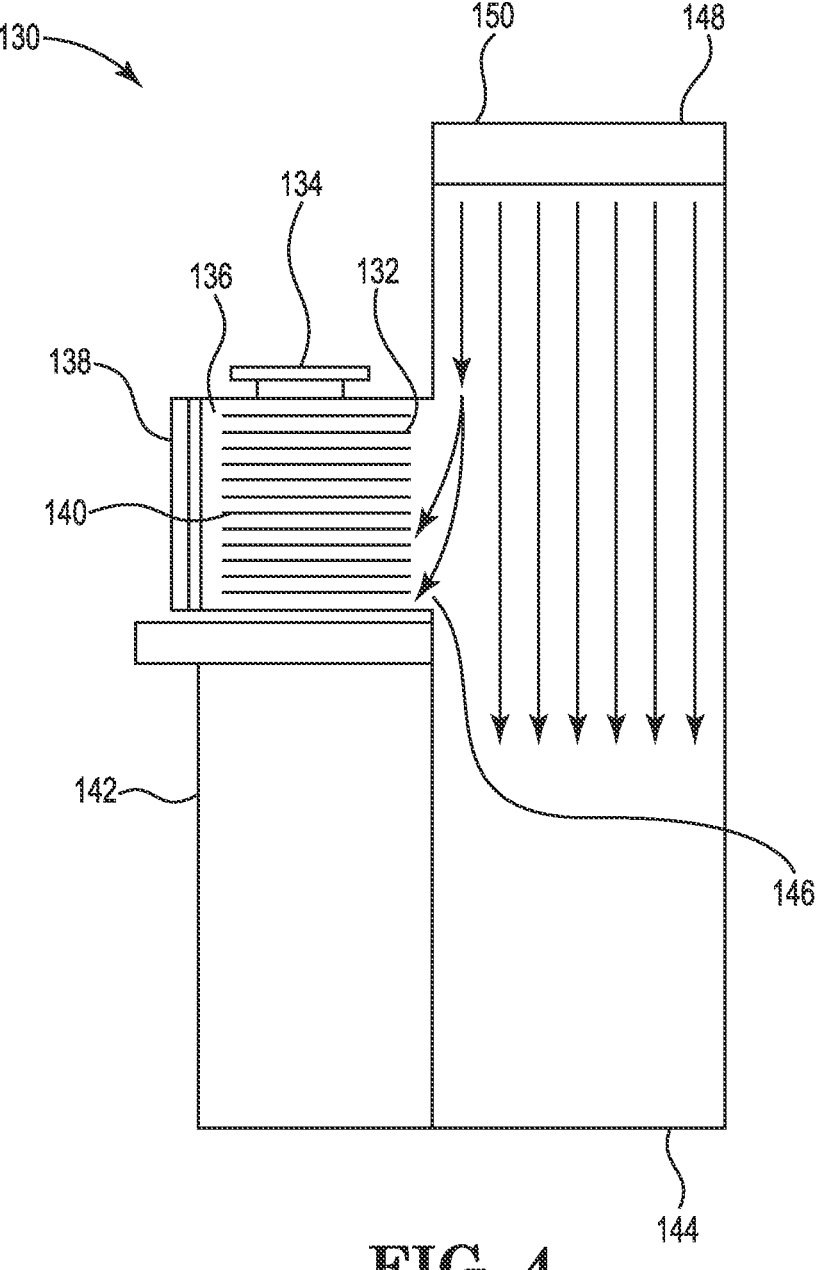
FIG. 4 is a schematic view of a substrate container interacting with an EFEM, according to at least one example embodiment.

FIG. 4 is a schematic view 130 of a substrate container 138 interacting with an EFEM 148, according to an embodiment. The substrate container 138 is docked on a load port 142 adjacent the EFEM 148. The substrate container 138 may be any front opening substrate carrier such as, for example, a FOUP, a front opening shipping box (FOSB), or a multi-application carrier (MAC). It will be generally understood by those of skill in the art that many of the concepts disclosed herein may have applicability to other substrate containers or carriers and more particularly other front opening or bottom opening substrate containers or carriers. The substrate container 138 may include an equipment hookup 134. When the substrate container 110 is attached to the EFEM 148, the front opening 132 of the substrate container 110 is positioned along an interior of EFEM 148.

In use, the substrate container 138 may dock on the load port 142, and a door of the load port 142 interfaces with a door (e.g., 125 of FIG. 3) of the substrate container 138 and disengages the door of the substrate container 138 from a shell of the substrate container 138. When the door of the substrate container 138 is disengaged (opened) from the shell, the EFEM 148 permits a robotic arm housed within the EFEM 148 to access the semiconductor wafers 140 stored within the substrate container 138. Gas (e.g. nitrogen, extra clean dry air, etc.) may flow through the EFEM 148 from a top 150 of the EFEM 148 to a bottom 144 of the EFEM 148, as indicated by the arrows in FIG. 4, to reduce contaminants within the EFEM 148.

When the front opening 132 of the substrate container 138 interfaces with the load port opening 146 of the EFEM 148 creating a FOUP-EFEM interface, some of the gas flowing through the EFEM 148 and across the load port opening 146 may flow into the interior 136 of the container 138, potentially interfering with the purging capabilities of the substrate container 138 by temporarily causing an increase in the internal environment such as the relative humidity and/or oxygen levels within the microenvironment of substrate container 138, which may be undesirable. In addition, not all EFEMs have the same construction. The size and dimensions of the EFEMs as well as the internal structure of the EFEMs may vary depending upon the manufacturer. The variability in size and construction between EFEMs of different manufactures may create differences in the purge performance of the substrate container 138 when the substrate container 138 is utilized with different EFEMs. It will be appreciated that during purging process of the substrate container 138, purge gas may be distributed throughout the interior of the container 138 including the front opening 132 to counter the turbulent flows of the gas from the EFEM 148 into the interior space 136 through the front opening 132. A controller (described in detail in FIGS. 6 and 7) may be configured to adjust the purge flow parameters (e.g., gas flow rate) for the substrate container 138 to achieve optimized environmental response (e.g., % RH, pressure, etc.) with impact from different EFEMs.

Figure 5:
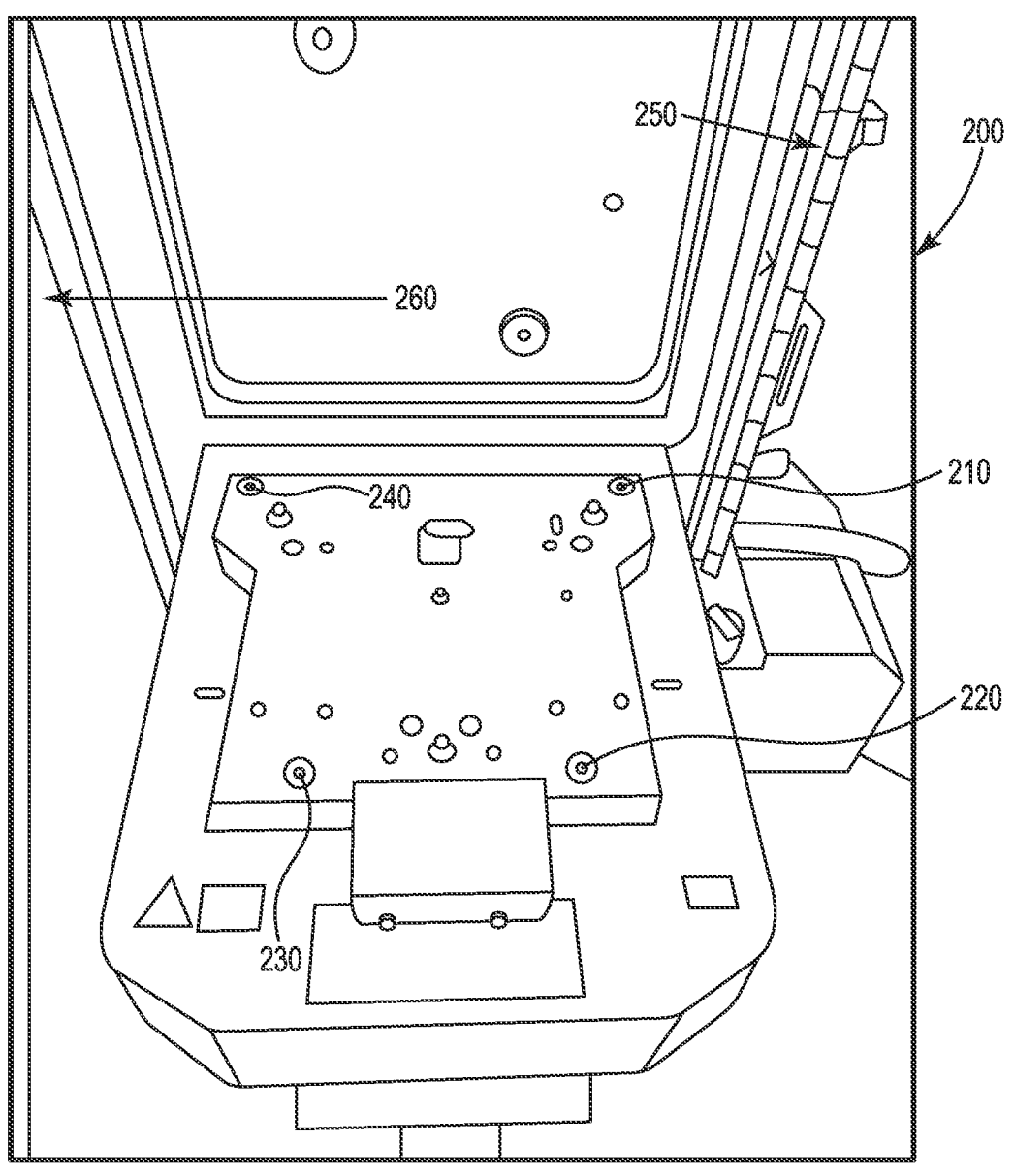
FIG. 5 illustrates a load port for docking a substrate container, according to at least one example embodiment.

FIG. 5 illustrates a load port 200 for docking a substrate container (not shown), according to an embodiment. The load port 200 includes inlets/outlets 210, 220, 230, 240, one or more of which may be configured as either an inlet or an outlet. An EFEM having a side wall 250 may attach to the substrate container, and an additional EFEM 260 may be adjacent to the EFEM. The substrate container (e.g., 110 of FIG. 2) may include inlet purge port(s) and outlet purge port(s) (e.g., 112A, 112B, 112C, etc. of FIG. 2) corresponding in position to, e.g., the outlet 210 and outlets 220, 230, and 240. In at least one example embodiment, during a door open purge process, e.g., an outlet 210 may have no intended effect and thus may not be used because the purge gas may flow out of the container through the opening (where the door is located when closed). In at least one example embodiment, purge gas may always flow through 220 and 230, but only sometimes through 240.

In operation, a first stream of a purge gas may be supplied to substrate container from any one of the inlets 220, 230, 240 through a first inlet purge port in the bottom wall of the shell. A second stream of another purge gas may be supplied to substrate container from an unused one of the inlets 220, 230, 240 through a second inlet purge port in the bottom wall of the shell. A third stream of purge gas may be supplied to substrate container from yet another one of the inlets 220, 230, 240 through a third inlet purge port in the bottom wall of the shell. As set forth above, the embodiments described and recited herein are not limited to three or fewer inlet ports; rather, the quantity of ports is provided for descriptive purposes only and is not intended to be limiting in any manner.

The purge gas may be discharged from the interior space of the substrate container from an outlet 210 through an outlet purge port in the bottom wall of the shell. Such configuration may be referred to as a 3 in/1 out configuration. Those of ordinary skill in the art recognize that other desirable configurations may also be included, such as for example, 2 in/2 out In at least one other example embodiment, a first stream of purge gas may be supplied to substrate container from one of the inlets 220, 230, 240 through a first inlet purge port in the bottom wall of the shell. A second stream of purge gas may be supplied to substrate container from an unused one of the inlets 220, 230, 240 through a second inlet purge port in the bottom wall of the shell. The purge gas may be discharged from the interior space of the substrate container from a first and a second outlets 210 through a first and a second outlet purge ports in the bottom wall of the shell. Such configuration may be referred to as a 2 in/2 out configuration.

Figure 6:
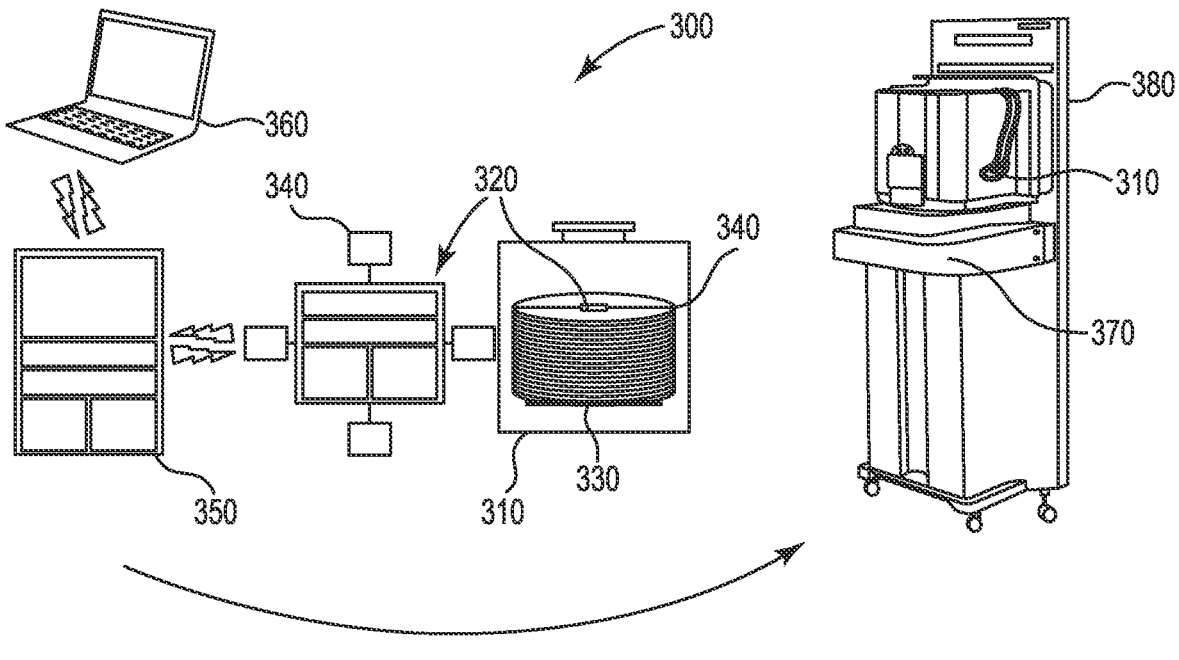
FIG. 6 is a schematic view of a system for a purge process for a substrate container, according to at least one example embodiment.

FIG. 6 is a schematic view of a system 300 for purging a substrate container 310, according to at least one example embodiment.

The system 300 includes a substrate container 310 having an interior space, one or more substrates 330 that may be inserted into the interior space, a first controller or processor 320 disposed in the interior space, and one or more sensors 340 coupled to the first processing device in the interior space. The sensor(s) 340 may be configured to detect at least one environmental condition in the interior space.

In at least one example embodiment, the container 310 may be a wafer or reticle carrier, e.g. a FOUP or a pod (such as an extreme ultraviolet light (EUV) reticle pod). The first controller 320 or the sensors 340, or combination thereof may be disposed on an inner wall or a door of the container 310. Alternatively, or in addition, first controller 320, one or more of the sensors 340, or a combination thereof may be disposed on a substrate 330 disposed in the container 310. In yet another example embodiment, the first controller 320, one or more of the sensors 340, or a combination thereof may be located at, e.g., front, back, right, and left of the interior space of the container 310 or on various slots (see e.g., FIG. 2) that accommodate the substrates 330. In yet another example embodiment, the first controller 320 and/or the sensor(s) 340 may be integrated to the inner wall or the door, or may be attached to the inner wall or the door.

The system 300 may also include a second controller or processor 350. In at least one example embodiment, the second controller 350 may be disposed externally of container 310. The first controller 320 is configured to communicate the at least one environmental condition (e.g., % RH) to the second controller 350. In at least another example embodiment, the second controller 350 may be located on the substrate, in or on the container 310, in the load port, in the EFEM, or combinations thereof. In at least another example embodiment, the second controller 350 may be a standalone controller or as part of a factory information system. In at least one example embodiment, the first controller 320 may directly communicate with a device 360 (e.g., a laptop or any other suitable devices). In such embodiment, the second controller 350 is housed in the device 360.

FIG. 6 shows, between the container 310 and the second controller 350, an enlarged view of the first controller 320 and four sensors 340. The first controller 320 and sensor(s) 340 are disposed in the container 310. In accordance with at least one embodiment, the four sensors 340 are disposed on or around the front, rear, left, and right edges of a first wafer in a stack of wafers (e.g., 25 wafers each is disposed in a slot). The first controller 320 is disposed in the middle of the first wafer. The quantity of sensors is not limited to that shown and described herein, but is rather provided for descriptive purposes only. In at least one example embodiment, the sensor(s) 340 may be disposed on a removable three dimensional lattice structure disposed inside the container 310. In at least one example embodiment, for door (of the container 310) open purge, the sensor(s) 340 may be positioned near the front opening of the container 310 to measure the conditions (e.g., environmental conditions and/or responses) at the confluence of the container 310 and the external environment. In at least another example embodiment, the sensors 340 may be equally distributed throughout the container 310 side walls or positioned in any other suitable or desired locations.

In at least one example embodiment, each wafer of the stack of wafers may have a similar set of sensors (e.g., five sensors 340, one on a center board with the first controller 320, and four on edges) on the wafer, each sensor on a given wafer corresponding to the first controller 320. However, embodiments described and recited herein are not so limited in quantity, but the quantity is provided for descriptive purposes only.

In at least one example embodiment, the first controller 320 may include a power source (e.g., battery or any other suitable power source), a communication module (e.g., bluetooth or any other suitable wire or wireless communication modules), and a memory. The memory may be configured to store the detected environmental condition (e.g., % RH data) obtained from the sensor(s) 340. The communication module may communicate the detected real-time % RH data to a communication module of the second controller 350 in real-time.

In at least one example embodiment, the second controller 350 may include a power source (e.g., battery or any other suitable power source), a communication module (e.g., blue-tooth or any other suitable wire or wireless communication modules), and a memory. The memory may be configured to store the detected real-time environmental condition (e.g., % RH data) obtained from the first controller 320. The second controller 350 may also include a display device (e.g., a LCD or any other suitable monitor) to display the obtained % RH data. In at least one example embodiment, the % RH data at the front, rear, left, and right edge of each of the 25 wafers may be displayed.

The first controller 320 and the second controller 350 may enable the real-time environmental condition (e.g., % RH data) inside the container 310 to be analyzed by the second controller 350 remotely. The first controller 320 may be disposed inside the sealed container 310 and wirelessly communicate the real-time % RH data to the second controller 350 that is disposed externally to the container 310. Advantageously, the real-time % RH data may be measured throughout the container 310 during a purge testing and adjustments may be made to one or more of the geometry, purge design, or EFEM configuration of the container 310. Adjustments to the purge design may include altering the configuration of the inlet/outlet purge ports, the purge gas flow rate, etc.). Such adjustments may be implemented to fine-tune and optimize the purge process in real-time.

The environmental condition (e.g., % RH data, oxygen levels, temperature, a measured presence of airborne molecular contaminant, and/or a measured presence of one or more volatile organic compounds) in the interior of the container may be measured at multiple locations within the container 310, e.g., per wafer slot and between the slots (e.g., 25 slots), and monitored remotely when the sensors 340 are e.g., hard-mounted to each silicon wafer or substrate, which is positioned in each of the wafer slots (e.g., 25 slots). The sensors may also be disposed on the inner wall(s) or the door (e.g., an inner side) of the container 310 so that the environmental conditions (e.g., % RH data) may be measured at a desired location.

The second controller 350 may communicate with sensor(s) outside of the container 310 that measure the ambient environmental conditions (e.g., % RH). The first controller 320 and/or the second controller 350 may communicate directly with a device 360 (e.g., a laptop or any other suitable devices) in wire or wirelessly. The second controller may be directly connected e.g., by USB to the device 360.

In the example embodiment of FIG. 6, the container 310 is docked on a load port 370 and is attached to an EFEM 380.

In operation, the second controller 350 may control streaming a purge working fluid (e.g., gas, etc.) into the interior space of the container 310 via inlet purge port(s), and discharging the purge working fluid from the interior space via outlet purge port(s), and varying purge flow parameters (e.g., gas flow rate, etc.) of the purge working fluid for a predetermined period of time. The second controller may further be configured to determine optimized purge flow parameters (e.g., gas flow rate, etc.) based on the varied purge flow parameters and the at least one detected environmental condition (e.g., % RH, pressure, temperature, etc.) inside the container 310 during the predetermined period of time.

Figure 7:
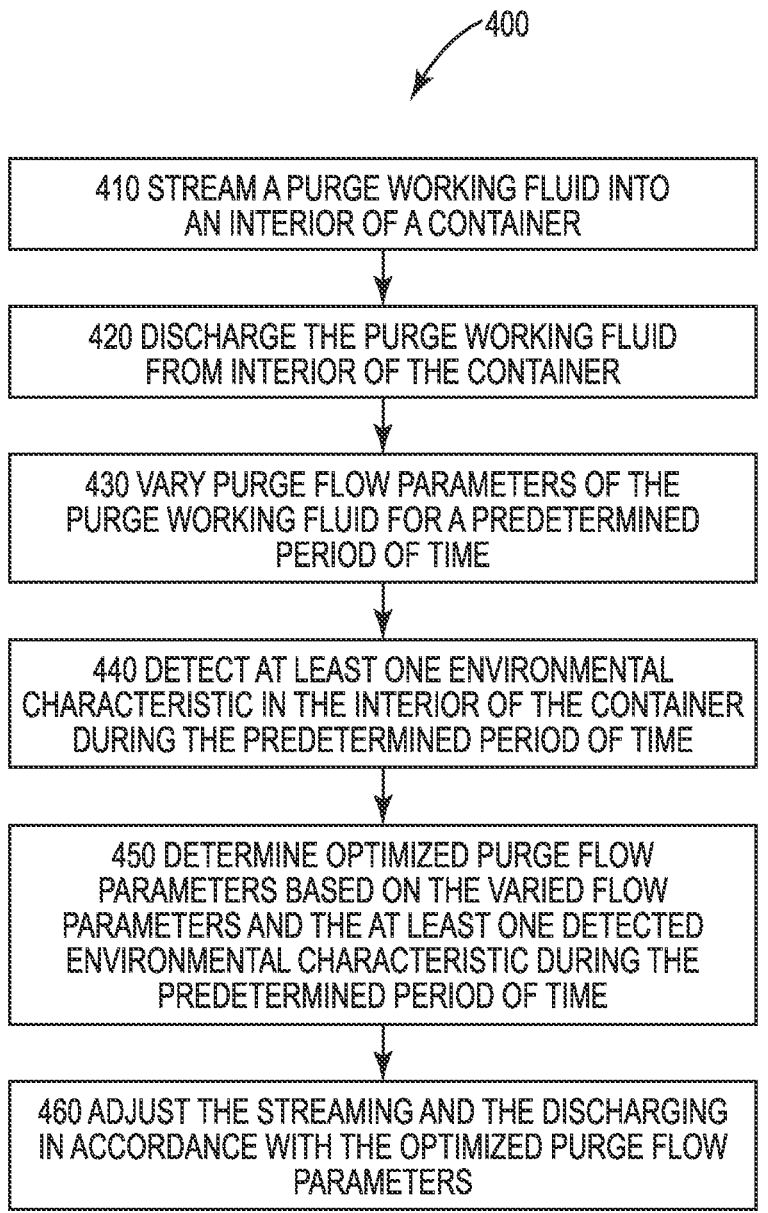
FIG. 7 is a flow diagram for a method of optimizing purge flow parameters in a container, according to at least one example embodiment.

FIG. 7 shows an operational flow 400 for optimizing purge flow parameters in a container, according to at least one example embodiment.

The operational flow 400 may include one or more operations, actions, or functions depicted by one or more blocks 410, 420, 430, 440, 450, and 460. Although illustrated as discrete blocks, various blocks may be divided into additional blocks, combined into fewer blocks, or eliminated, depending on the desired implementation. As a non-limiting example, the description of the method 400, corresponding to the depiction thereof in FIG. 7 and performed by one or more of the apparatuses or components shown in system 300, according to one or more example embodiments described herein, pertains to optimizing purge flow parameters in a container. The processing flow 400 may begin at block 410.

Block 410 may refer to controller 350 streaming a purge working fluid into an interior of a container via inlet purge port(s) of the container, which may be a wafer or reticle container (e.g., a FOUP). The purge working fluid may include one or more of nitrogen, clean dry air (CDA), extra clean dry air (xCDA), gas for conditioning a container environment, or any other suitable fluid. Block 410 may be followed by block 420.

Block 420 may refer to controller 350 discharging the purge working fluid from the interior of the container via outlet purge port(s) of the container. Block 420 may be followed by block 430.

Block 430 may refer to controller 350 varying purge flow parameters of the purge working fluid for a predetermined period of time. In at least one example embodiment, the purge flow parameters include flow rate of the purge working fluid (e.g., at each inlet/outlet purge port or diffuser). In at least one example embodiment, the purge flow parameters may be varied by varying geometry of the container shell and/or the door of the container, varying inlet and/or outlet purge port configuration and/or geometry, and/or varying diffuser geometry, etc.

In at least one example embodiment, varying the purge flow parameters includes changing the purge flow parameters from a first predetermined configuration to a second predetermined configuration, e.g., from a lower flow rate to a higher flow rate or vice-versa The purge flow parameters (e.g., gas flow rate) may be changed discretely (e.g., changing the purge flow parameters every predetermined period of time such as every two minutes) or continuously (e.g., gradually changing the purge flow parameters from a first value to a second value during or within a determined period of time), from the first predetermined configuration to the second predetermined configuration. Block 430 may be followed by block 440.

Block 440 may refer to one or more of sensors 340 detecting at least one environmental condition in the interior of the container during the predetermined period of time. The at least one environmental condition may include one or more of relative humidity (% RH), pressure (e.g., absolute pressure), oxygen levels, temperature, a measured presence of airborne molecular contaminant, a measured presence of one or more volatile organic compounds, etc. The at least one environmental condition may be communicated from the one or more sensors 340 to the controller 350 by the controller 320. Block 440 may be followed by block 450.

Block 450 may refer to controller 350 determining optimized purge flow parameters based on the varied purge flow parameters and the at least one detected environmental condition during the predetermined period of time.

In at least one example embodiment, the optimized purge flow parameters (e.g., the gas flow rate) may be obtained or determined by, e.g., achieving a desired (predetermined, or optimal) environmental response (e.g., inside the container). The desired environmental response may include adjusting one or more of relative humidity (% RH), oxygen levels, temperature, a measured presence of airborne molecular contaminant, and/or a measured presence of one or more volatile organic compounds in the interior of the container to a respective predetermined threshold level. The desired environmental response may also include producing a desired pressure (e.g., absolute pressure) in the interior of the container. The environmental response may be detected or measured by sensor(s) inside the container and the detected data may be communicated to controller(s) outside of the container.

During the predetermined period of time (the time for the purge testing), various operational scenarios may occur, including a door of the container being open during the predetermined period of time; the door of the container being closed during the predetermined period of time; changing a number of substrates (e.g., wafers) in the interior of the container during the predetermined period of time; changing slots (e.g., locations) of substrates in the interior of the container during the predetermined period of time;

opening the door within the predetermined period of time when the door of the container is closed; closing the door within the predetermined period of time when the door of the container is open; changing a configuration of an EFEM (e.g., flow effects from the EFEM geometry and flow parameters of the EFEM) during the predetermined period of time; changing a position (e.g., left or right or center) of the container relative to an automation apparatus or database during the predetermined period of time (e.g., the EFEM may attach to or include three load ports: a left load port, a center load port, and a right load port; the container may be positioned on any one of the load ports, and the position of the container may be changed from one load port to another, which may affect flow patterns from the EFEM into the container); removing substrates from the interior of the container during the predetermined period of time; placing substrates into the interior of the container during the predetermined period of time; changing conditions (e.g., moisture, contamination, etc.) of substrates in the interior of the container during the predetermined period of time; changing purge inlet ports and purge outlet ports configurations (e.g., from 3 in/1 out to 2 in/2 out or vice versa, change to/from n+1 (n in/1 out where n is four or more) configuration) for the container during the predetermined period of time, etc. The controller (e.g., 350 of FIG. 6 or any other suitable controller) analyzes the environmental response(s) and determines optimized purge flow parameters (e.g., gas flow rate) to each applicable operational scenario. In an embodiment, the controller analyzing the environmental response(s) and determining optimized purge flow parameters to each applicable operational scenarios may be achieved via design of experiments (DOEs), a trained neural network, modeling, etc.

Purge efficiency, purge performance, and/or purge flow parameters may be subject to variation due to various operational scenarios. The corresponding optimized purge flow parameters under each operational scenarios to achieve the desired environmental response may be saved as corresponding individualized purge "recipes" available for optimizing the desired environmental response during the purge process when the corresponding operational scenario occurs. In at least one example embodiment, if the optimization has been performed for a container, then the controller may act (e.g., purge the container using a recipe corresponding to such container) in real-time. Block 450 may be followed by block 460.

Block 460 may refer to controller 350 adjusting the streaming and the discharging in accordance with the optimized purge flow parameters. For example, the controller 350 may provide optimal purge "recipe" or control to the load port.

One of more of the optimized purge efficiency, purge performance, or purge flow parameters may minimize the purge gas (e.g., nitrogen) to adequately protect the contents of the substrate container. In at least one example embodiment, the adjusting at block 460 may be performed when the purge process operation has commenced (i.e., after the purge testing to determine the "recipes"). The controller 350 may choose the correct (the best or corresponding) purge "recipe" for the given scenarios and adjust the purge flow rate accordingly to achieve the desired environmental response. As such, purge efficiency and purge performance may be optimized for each scenario, which may increase yield and minimize gas (e.g., nitrogen) consumption.

Figure 8:
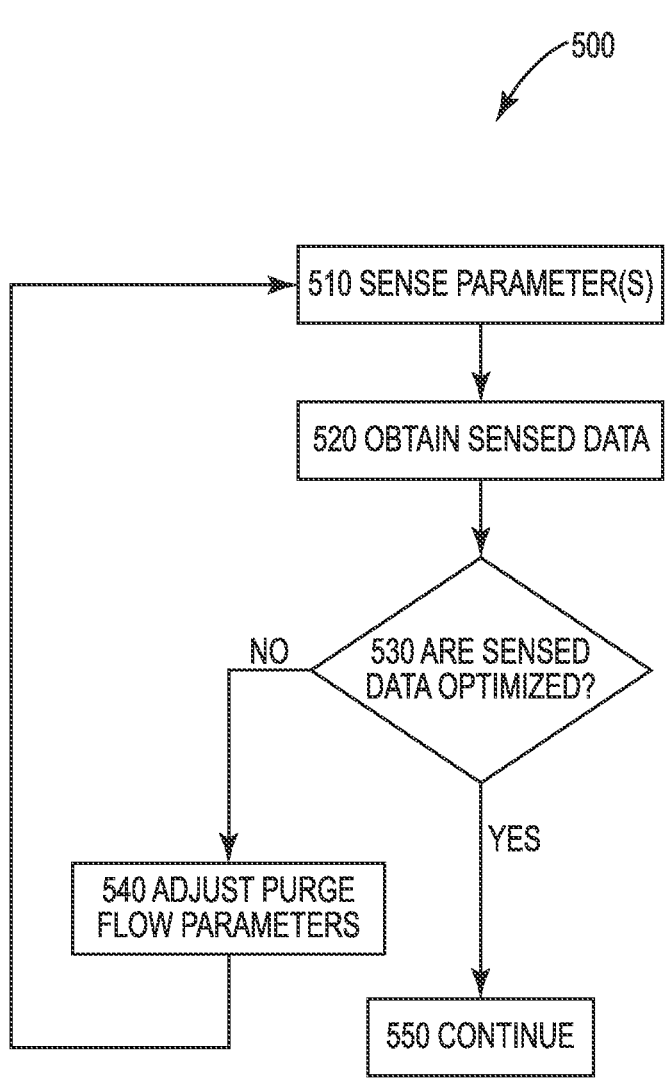
FIG. 8 is a flow diagram for a method of optimizing a sensor response in a container, according to at least one example embodiment.

FIG. 8 is a flow diagram of a method 500 of optimizing a sensor response (e.g., sensed data or parameters) in a container, according to at least one example embodiment.

The processing flow 500 may include one or more operations, actions, or functions depicted by one or more blocks 510, 520, 530, 540, and 550. Although illustrated as discrete blocks, various blocks may be divided into additional blocks, combined into fewer blocks, or eliminated, depending on the desired implementation. As a non-limiting example, the description of the method 500, corresponding to the depiction thereof in FIG. 8 and performed by one or more of the apparatuses or components shown in system 300, according to one or more example embodiments described herein, pertains to optimizing a sensor response in a container. The processing flow 500 may begin at block 510.

Block 510 may refer to one or more sensors 340 detecting at least one environmental condition in the interior of the container. The at least one environmental condition may include one or more of relative humidity (% RH), pressure (e.g., absolute pressure), oxygen levels, temperature, a measured presence of airborne molecular contaminant, a measured presence of one or more volatile organic compounds, etc. Block 510 may be followed by block 520.

Block 520 may refer to a controller (e.g., 320, or 350 via 320) obtaining the detected/sensed at least one environmental condition from the one or more sensors 340. Block 520 may be followed by block 530.

Block 530 may refer to the controller determining whether the detected/sensed at least one environmental condition matches/is a desired (predetermined, or optimal) environmental condition. If yes, block 530 may be followed by block 550. If no, block 530 may be followed by block 540.

Block 550 may refer to the automation (including the controller) continuing its predetermined operation.

Block 540 may refer to the controller adjusting or varying (see block 430) purge flow parameters (e.g., the gas flow rate) based on the detected/sensed at least one environmental condition. Block 540 may be followed by block 510.

Figure 9:
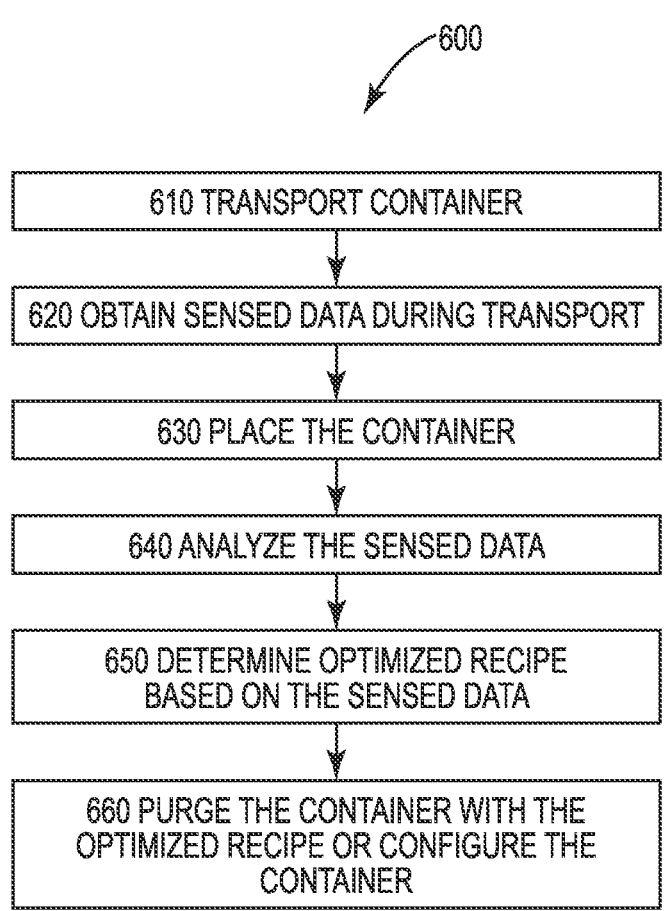
FIG. 9 is a flow diagram for a method of operating an optimized purge process in a container, according to at least one example embodiment.

FIG. 9 is a flow diagram of a method 600 of operating an optimized purge process in a container, according to at least one example embodiment.

The processing flow 600 may include one or more operations, actions, or functions depicted by one or more blocks 610, 620, 630, 640, 650, and 660. Although illustrated as discrete blocks, various blocks may be divided into additional blocks, combined into fewer blocks, or eliminated, depending on the desired implementation. As a non-limiting example, the description of the method 600, corresponding to the depiction thereof in FIG. 9 and performed by one or more of the apparatuses or components shown in system 300, according to one or more example embodiments described herein, pertains to operating an optimized purge process in a container. The processing flow 600 may begin at block 610.

Block 610 may refer to the automation system transporting the container from a first location to a second location. Block 610 may be followed by block 620.

Block 620 (see blocks 510 and 520) may refer to a controller (e.g., 320, or 350 via 320) obtaining a detected/sensed at least one environmental condition from one or more sensors 340 during transport. Block 620 may be followed by block 630.

Block 630 may refer to the automation system placing the container at the second location (e.g., a port of use). Block 630 may be followed by block 640.

Block 640 may refer to a controller (e.g., 320, or 350 via 320) analyzing one or more of the detected or sensed at least one environmental condition (e.g., to determine whether there is an optimized recipe corresponding to the detected or sensed at least one environmental condition, see block 450). Block 640 may be followed by block 650.

Block 650 may refer to the controller determining the optimized recipe corresponding to the detected/sensed at least one environmental condition (see block 450) if there is one. Block 650 may be followed by block 660.

Block 660 may refer to the controller controlling a purge process for the container with the optimized recipe if there is one from block 650, or configuring the container to obtain an optimized recipe for the detected/sensed at least one environmental condition (see blocks 410-450).

Aspects:

Any of aspects 1-26 may be combined with any of aspects 27-30, and any one of aspects 1-30 may be combined with any one of aspects 31-37.

Aspect 1. A method of optimizing purge flow parameters in a front opening unified pod (FOUP), comprising:

streaming a purge working fluid into an interior of the FOUP;

discharging the purge working fluid from the interior of the FOUP;

varying purge flow parameters of the purge working fluid for a predetermined period of time;

detecting at least one environmental condition in the interior of the FOUP during the predetermined period of time;

determining optimized purge flow parameters based on the varied purge flow parameters and the at least one detected environmental condition during the predetermined period of time, and adjusting the streaming and the discharging in accordance with the optimized purge flow parameters.

Aspect 2. The method according to aspect 1, further comprising:

communicating the at least one environmental condition to an automation apparatus.

Aspect 3. The method according to aspect 1 or aspect 2, wherein the purge working fluid includes one or more of nitrogen, clean dry air, extra clean dry air, and gas for conditioning a container environment.

Aspect 4. The method according to any one of aspects 1-3, wherein the at least one environmental condition includes one or more of relative humidity, pressure, oxygen levels, temperature, and a measured presence of airborne molecular contaminant or one or more volatile organic compounds.

Aspect 5. The method according to any one of aspects 1-4, wherein the varying includes changing the purge flow parameters from a first predetermined configuration to a second predetermined configuration.

Aspect 6. The method according to any one of aspects 1-5, wherein the optimized purge flow parameters are determined to adjust one or more of relative humidity, oxygen levels, temperature, and a measured presence of airborne molecular contaminant or one or more volatile organic compounds in the interior of the FOUP to a respective predetermined threshold level.

Aspect 7. The method according to any one of aspects 1-6, wherein the optimized purge flow parameters are determined to produce a desired pressure in the interior of the FOUP.

Aspect 8. The method according to any one of aspects 1-7, wherein a door to the interior of the FOUP is open during the predetermined period of time.

Aspect 9. The method according to any one of aspects 1-7, wherein a door to the interior of the FOUP is closed during the predetermined period of time.

Aspect 10. The method according to any one of aspects 1-9, further comprising:

changing a number of substrates in the interior of the FOUP during the predetermined period of time.

Aspect 11. The method according to any one of aspects 1-10, further comprising:

changing slots of substrates in the interior of the FOUP during the predetermined period of time.

Aspect 12. The method according to any one of aspects 1-11, further comprising:

opening the door within the predetermined period of time when a door to the interior of the FOUP is closed.

Aspect 13. The method according to any one of aspects 1-11, further comprising:

closing the door within the predetermined period of time when a door to the interior of the FOUP is open.

Aspect 14. The method according to any one of aspects 1-13, further comprising:

changing a configuration of an equipment front end module during the predetermined period of time.

Aspect 15. The method according to any one of aspects 1-14, further comprising:

changing a position of the FOUP relative to an automation apparatus during the predetermined period of time.

Aspect 16. The method according to any one of aspects 1-15, further comprising:

removing substrates from the interior of the FOUP during the predetermined period of time.

Aspect 17. The method according to any one of aspects 1-16, further comprising:

placing substrates into the interior of the FOUP during the predetermined period of time.

Aspect 18. The method according to any one of aspects 1-17, further comprising:

changing conditions of substrates in the interior of the FOUP during the predetermined period of time.

Aspect 19. The method according to any one of aspects 1-18, further comprising:

changing purge inlet ports and purge outlet ports configurations for the FOUP during the predetermined period of time.

Aspect 20. The method according to any one of aspects 1-19, wherein the purge flow parameters includes a flow rate.

Aspect 21. The method according to any one of aspects 1-20, wherein a sensor is configured to detect the at least one environmental condition.

Aspect 22. The method according to aspect 21, wherein the sensor is integral to an inner wall of the FOUP.

Aspect 23. The method according to aspect 21, wherein the sensor is integral to a door of the FOUP.

Aspect 24. The method according to aspect 21, wherein the sensor is attached to a wall of the FOUP.

Aspect 25. The method according to aspect 21, wherein the sensor is attached to a door of the FOUP, or is disposed within or adjacent to a purge module.

Aspect 26. The method according to aspect 21, wherein the sensor is located on a wafer disposed in the FOUP.

Aspect 27. A system, comprising:

a front opening unified pod (FOUP) or a pod having an interior space;

a substrate to insert into the interior space;

a first processing device disposed in the interior space; and a sensor, coupled to the first processing device and disposed in the interior space, the sensor being configured to detect at least one environmental condition in the interior space.

Aspect 28. The system according to aspect 27, wherein the sensor is located on an inner wall of the FOUP or pod or a door of the FOUP or pod, the sensor is integral to the inner wall or the door, or is attached to the inner wall or the door.

Aspect 29. The system according to aspect 27, wherein the sensor is located on a wafer disposed in the FOUP or pod.

Aspect 30. The system according to any one of aspects 27-29, further comprising:

a second processing device disposed outside of the interior space;

wherein the second processing device is configured to control:

streaming a purge working fluid into the interior space, discharging the purge working fluid from the interior space, and varying purge flow parameters of the purge working fluid for a predetermined period of time;

the first processing device is configured to communicate the at least one environmental condition to the second processing device; and the second processing device is configured to determine optimized purge flow parameters based on the varied purge flow parameters and the at least one detected environmental condition during the predetermined period of time.

Aspect 31. A method of optimizing purge flow parameters in a container, comprising:

streaming a purge working fluid into an interior of the container;

discharging the purge working fluid from the interior of the container;

varying purge flow parameters of the purge working fluid for a predetermined period of time;

detecting at least one environmental condition in the interior of the container during the predetermined period of time;

determining optimized purge flow parameters based on the varied purge flow parameters and the at least one detected environmental condition during the predetermined period of time, and adjusting the streaming and the discharging in accordance with the optimized purge flow parameters.

Aspect 32. A method of generating a purge recipe, comprising:

streaming a purge working fluid into an interior of a container;

discharging the purge working fluid from the interior of the container;

varying purge flow parameters of the purge working fluid for a predetermined period of time;

detecting at least one environmental condition in the interior of the container during a predetermined period of time;

determining optimized purge flow parameters based on the varied purge flow parameters and the at least one detected environmental condition during the predetermined period of time; and generating the purge recipe based on the optimized purge flow parameters.

Aspect 33. A method of optimizing a sensor response in a container, comprising:

(a) detecting at least one environmental condition in an interior of the container;

when the at least one environmental condition does not match an optimized environmental condition, varying purge flow parameters of a purge working fluid and proceeding to (a).

Aspect 34. A method of determining a purge recipe, comprising:

streaming a purge working fluid into an interior of a container;

discharging the purge working fluid from the interior of the container;

varying purge flow parameters of the purge working fluid for a predetermined period of time;

detecting at least one environmental condition in the interior of the container during a predetermined period of time;

determining optimized purge flow parameters based on the varied purge flow parameters and the at least one detected environmental condition during the predetermined period of time; and determine the purge recipe based on the optimized purge flow parameters.

Aspect 35. A method comprising varying purge flow parameters of a purge working fluid in an interior of a front opening unified pod by detecting in real-time at least one environmental condition in the interior of the front opening unified pod.

Aspect 36. A method comprising varying in real-time purge flow parameters of a purge working fluid in an interior of a front opening unified pod by detecting at least one environmental condition in the interior of the front opening unified pod.

Aspect 37. A method comprising varying in real-time purge flow parameters of a purge working fluid in an interior of a front opening unified pod by detecting in real-time at least one environmental condition in the interior of the front opening unified pod.

The examples disclosed in this application are to be considered in all respects as illustrative and not limitative. The scope of the invention is indicated by the appended claims rather than by the foregoing description; and all changes which come within the meaning and range of equivalency of the claims are intended to be embraced therein.

The terminology used in this specification is intended to describe particular embodiments and is not intended to be limiting. The terms "a," "an," and "the" include the plural forms as well, unless clearly indicated otherwise. The terms "comprises" and/or "comprising," when used in this specification, specify the presence of the stated features, integers, steps, operations, elements, and/or components, but do not preclude the presence or addition of one or more other features, integers, steps, operations, elements, and/or components.

With regard to the preceding description, it is to be understood that changes may be made in detail, especially in matters of the construction materials employed and the shape, size, and arrangement of parts without departing from the scope of the present disclosure. This specification and the embodiments described are exemplary only, with the true scope and spirit of the disclosure being indicated by the claims that follow.

What is claimed is:

1. An equipment front end module system, comprising:

A substrate container having an internal space;

a first controller attached to the substrate container a second controller external to the interior space a sensor within the internal space, communicatively coupled to the first controller, the sensor being configured to detect at least one environmental condition in the interior space;

wherein the second controller is configured to determine optimized purge flow parameters based on varied purge flow parameters of a purge working fluid and the at least one detected environmental condition during a predetermined period of time, and wherein the first controller adapts purge flow parameters during open or closed door purge processes based on the at least one environmental condition.

2. The equipment front end module system according to claim 1, wherein the second controller is configured to control:

streaming a purge working fluid into the interior space, and discharging the purge working fluid from the interior space wherein the first controller is configured to communicate the at least one environmental condition to the second controller.

3. The equipment front end module system according to claim 2, wherein the purge working fluid includes one or more of nitrogen, clean dry air, and gas for conditioning a container environment;

wherein the at least one environmental condition includes one or more of relative humidity, pressure, oxygen levels, temperature, and a measured presence of airborne molecular contaminant or one or more volatile organic components.

4. The equipment front end module system according to claim 2, wherein the optimized purge flow parameters are determined to adjust one or more of relative humidity, oxygen levels, temperature, and a measured presence of airborne molecular contaminant or one or more volatile organic compounds in the interior of the substrate container to a respective predetermined threshold.

5. The equipment front end module system according to claim 2, wherein the optimized purge flow parameters are determined to produce a desired pressure in the interior of the substrate container.

6. The equipment front end module system according to claim 2, wherein a door to the interior of the substrate container is open during the predetermined period of time.

7. The equipment front end module system according to claim 1, wherein the first controller communicates the at least one environmental condition to an automation apparatus or database.

8. The equipment front end module system according to claim 1, wherein the substrate container is a front opening unified pod or a reticle pod.

9. The equipment front end module system according to claim 1, wherein the first controller adapts the purge process in real-time.

* * * * *